United States Patent
Minamio et al.

(10) Patent No.: US 7,629,688 B2
(45) Date of Patent: Dec. 8, 2009

(54) BONDED STRUCTURE AND BONDING METHOD

(75) Inventors: Masanori Minamio, Osaka (JP); Hiroaki Fujimoto, Osaka (JP); Atsuhito Mizutani, Kyoto (JP); Hisaki Fujitani, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 167 days.

(21) Appl. No.: 11/491,029

(22) Filed: Jul. 24, 2006

(65) Prior Publication Data

US 2007/0035035 A1    Feb. 15, 2007

(30) Foreign Application Priority Data

Aug. 15, 2005  (JP) ............................. 2005-235261

(51) Int. Cl.
*H01L 23/48* (2006.01)
(52) U.S. Cl. .................. 257/738; 257/780; 257/781; 257/E23.015

(58) Field of Classification Search ............... 257/758, 257/760, 750, 779, 771, 772, 780, 781, 784, 257/738, E23.015, E23.02, E25.013, E25.006, 257/786
See application file for complete search history.

(56) References Cited

U.S. PATENT DOCUMENTS

| 7,323,805 B2* | 1/2008 | Sano et al. ................... 310/358 |
| 2002/0072201 A1* | 6/2002 | Potter .......................... 438/455 |

FOREIGN PATENT DOCUMENTS

| JP | 2002-027595 | 1/2002 |
| JP | 2005-193336 | 7/2005 |

* cited by examiner

*Primary Examiner*—Davienne Monbleau
*Assistant Examiner*—Hoa B Trinh
(74) *Attorney, Agent, or Firm*—McDermott Will & Emery LLP

(57) ABSTRACT

An aluminum wire is bonded to a silicon electrode by a wedge tool pressing the aluminum wire against the silicon electrode. In this way, a firmly bonded structure is obtained by sequentially stacking aluminum, aluminum oxide, silicon oxide, and silicon.

19 Claims, 3 Drawing Sheets

BONDED STRUCTURE AND BONDING METHOD

CROSS-REFERENCE TO RELATED APPLICATIONS

The disclosure of Japanese Patent Application No. 2005-235261 filed Aug. 15, 2005 including specification, drawing and claims is incorporated herein by reference in its entirely.

BACKGROUND OF THE INVENTION (1) Field of the Invention

The present invention relates to bonded structures and bonding methods, and more particularly relates to bonded structures between aluminum and silicon and methods for bonding therebetween.

(2) Description of Related Art

In recent years, attention has been given to a micro-electro-mechanics (MEMS) technology as a technology for fabricating a precise micro-device and the technology has been actively researched. The currently dominating MEMS technology is a technology obtained by combining technologies of a plurality of types, such as technologies for semiconductor fabrication, machining and electric circuits, as disclosed in Japanese Unexamined Patent Publication No. 2005-193336. A big feature of this currently dominating technology is that the structure of a device is built at a silicon wafer by etching the silicon wafer.

When the device structure is built at a silicon wafer as described above, electric circuits for drive, control and any other operation of the device can also be formed integrally on the same silicon wafer. This provides advantages, for example, also in terms of miniaturization of devices. The above-mentioned technology has come to be used, for example, for microphones of cell phones (Japanese Unexamined Patent Publication No. 2002-27595).

SUMMARY OF THE INVENTION

However, since in the MEMS technology the device structure is built at a silicon wafer by etching, not only silicon but also aluminum or copper that will become an interconnect for a semiconductor device are removed. As a result, an electrode part of the device is occupied by silicon or silicon dioxide just after the device structure is completed. In order to introduce power from outside into this device and receive or deliver an electric signal from or to outside, this device needs to be connected to an external circuit by any method. In this case, in order to carry out gold wire bonding that allows reliable connection between this device and the external circuit in the simplest manner, a metal layer of gold or aluminum needs to be formed in the electrode part of this device by plating or any other method. The formation of the metal layer significantly increases the cost and price of such a device.

The present invention is made in view of the above-mentioned problems, and an object of the present invention is to provide a bonded structure and a bonding method that allow reliable bonding between silicon and aluminum at low cost.

In order to solve the above-mentioned problem, a bonded structure between aluminum and silicon according to a first aspect of the present invention is configured as follows. A layer of aluminum oxide and a layer of silicon oxide exist between the aluminum and the silicon, and the aluminum, the layer of aluminum oxide, the layer of silicon oxide, and the silicon are sequentially stacked.

It is preferable that the layer of aluminum oxide and the layer of silicon oxide each have a substantially uniform thickness.

The sum of the thicknesses of the respective layers of aluminum oxide and silicon oxide is preferably 0.1 nm through 10 nm both inclusive.

A natural oxide film existing on the top surface of part of the silicon that is not bonded to the aluminum preferably has a larger thickness than the layer of silicon oxide.

At least part of the aluminum coming into contact with the layer of aluminum oxide preferably contains silicon.

Part of the silicon coming into contact with the layer of silicon oxide preferably contains aluminum.

A bonded structure according to a second aspect of the present invention is a bonded structure between an aluminum wire containing silicon and a silicon electrode. In the bonded structure, a part of the aluminum wire bonded to the silicon electrode is crushed and deformed, and the crushed part of the aluminum wire has a larger silicon content than part thereof that is not deformed.

In one preferred embodiment, a layer of aluminum oxide and a layer of silicon oxide exist at the interface at which the aluminum wire and the silicon electrode are bonded to each other, while coming into contact with each other, the aluminum wire comes into contact with the layer of aluminum oxide and the silicon electrode comes into contact with the layer of silicon oxide.

The sum of the thicknesses of the respective layers of aluminum oxide and silicon oxide is preferably 0.1 nm through 10 nm both inclusive.

The width of the crushed and deformed part of the aluminum wire is preferably 1.5 times or more as large as the diameter of the part thereof that is not deformed.

It is preferable that the crushed and deformed part of the aluminum wire partly exists outside the silicon electrode.

A bonding method according to the present invention is a method for bonding aluminum and silicon. The method includes the steps of: bringing a component of aluminum into contact with a component of silicon; and bonding aluminum and silicon by pressing the component of aluminum against the component of silicon under an oxygen atmosphere using a crimping and oscillating member and applying ultrasound to the component of aluminum using the crimping and oscillating member, wherein in the bonding step, a layer of aluminum oxide and a layer of silicon oxide are formed between the component of aluminum and the component of silicon.

In another preferred embodiment, in the bonding step, a natural oxide film of silicon existing on the top surface of the component of silicon is removed and the layer of aluminum oxide and the layer of silicon oxide are formed.

In still another preferred embodiment, in the bonding step, the crimping and oscillating member presses the component of aluminum against the component of silicon at a force of 0.14 N through 0.4 N both inclusive and applies ultrasound to the component of aluminum for 30 ms through 50 ms both inclusive.

DETAILED DESCRIPTION OF THE INVENTION

Figure 1:
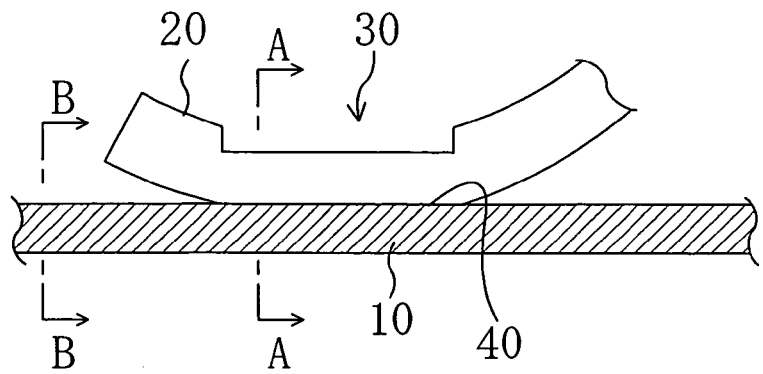
FIG. 1 is a cross-sectional view in which an aluminum wire is bonded to a silicon electrode according to a first embodiment.

Embodiments of the present invention will now be described in detail with reference to the drawings. In the drawings that will be referred to below, for simplification of the description, components having substantially the same function are denoted by the same reference numeral.

Embodiment 1

A first embodiment relates to a bonded structure and a method for bonding, by wedge bonding, aluminum wires to silicon electrodes formed in the top surface of a silicon substrate at which semiconductor devices are formed.

In this embodiment, as illustrated in FIG. 1, an aluminum wire 20 is bonded to a silicon electrode 40 formed in the top surface of a silicon substrate 10. Polysilicon (polycrystalline silicon) having excellent electrical characteristics is used for the silicon electrode 40. The aluminum wire 20 is obtained by alloying aluminum with silicon and therefore contains 1% silicon. The reason for this is that the mechanical characteristics of the aluminum wire 20, such as the bending strength thereof, and the bonding performance thereof are improved. A part 30 of the aluminum wire 20 bonded to the silicon electrode 40 (hereinafter, referred to as "bonded part 30") is crushed by the later-described wedge tool so as to be deformed. The bonded part 30 of the aluminum wire 20 is mechanically firmly bonded to the silicon electrode 40. Therefore, even when the silicon substrate 10 is vibrated or even when the aluminum wire 20 is pulled to some extent, the aluminum wire 20 is not separated from the silicon electrode 40.

Figures 5A, 5B:
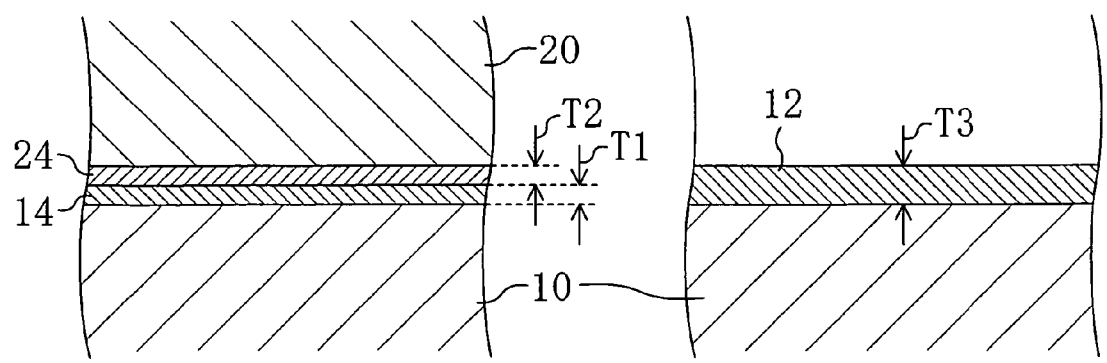
FIG. 5A is a cross-sectional view taken along the line A-A in FIG. 1.
FIG. 5B is a cross-sectional view taken along the line B-B in FIG. 1.

FIG. 5A is an enlarged view illustrating a cross section taken along the line A-A in FIG. 1, and FIG. 5B is an enlarged view illustrating a cross section taken along the line B-B in FIG. 1. As seen from FIG. 5A, a layer 24 of aluminum oxide and a layer 14 of silicon oxide are interposed between the bonded part 30 of the aluminum wire 20 and the silicon substrate 10 (the silicon electrode 40). When expressed in chemical symbols, the layer 24 of aluminum oxide is made of, for example, $Al_2O_3$, and the layer 14 of silicon oxide is made of, for example, $SiO_2$. The following layers are sequentially stacked: the aluminum wire 20, the layer 24 of aluminum oxide, the layer 14 of silicon oxide, and the silicon substrate 10. The layer 24 of aluminum oxide comes into contact with the layer 14 of silicon oxide and the aluminum wire 20, and the layer 14 of silicon oxide further comes into contact with the silicon substrate 10.

The respective layers 24 and 14 of aluminum oxide and silicon oxide extend under the whole bonded part 30, and their respective most parts except for their respective parts located under an end part of the bonded part 30 each have a substantially uniform thickness. In this embodiment, the layer 24 of aluminum oxide has a thickness T2 of approximately 0.4 nm, and the layer 14 of silicon oxide has a thickness T1 of approximately 0.6 nm. Hence, the sum of the thicknesses of the layers 14 and 24 is approximately 1 nm. On the other hand, as illustrated in FIG. 5B, a natural oxide film 12 of silicon is formed on the top surface of a part of the silicon substrate 10 that is not bonded to the aluminum wire 20, and its thickness T3 is approximately 1 nm, which is thicker than the thickness T1 of the layer 14 of silicon oxide. The reason for this is as follows. When the aluminum wire 20 is pressed against the natural oxide film 12 of silicon with ultrasound and a load applied onto the natural oxide film 12 of silicon, the natural oxide film 12 of silicon is once destroyed. As a result, a new surface of silicon is formed, and therefore the layer 14 of silicon oxide is newly formed at the interface at which the aluminum wire 20 is bonded to the silicon substrate 10.

Since the above-described two thin layers 14 and 24 of oxides are interposed between the bonded part 30 of the aluminum wire 20 and the silicon electrode 40, the aluminum wire 20 and the silicon electrode 40 are mechanically firmly bonded to each other and electrically connected to each other. More particularly, the aluminum wire 20 is electrically connected through the layer 24 of aluminum oxide and the layer 14 of silicon oxide to the silicon electrode 40. The reason for this is that the two layers 14 and 24 of oxides are thin. In particular, the thickness T1 of the layer 14 of silicon oxide is smaller than the thickness T3 of the natural oxide film 12 of silicon. The sum T1+T2 of the thickness T2 of the layer 24 of aluminum oxide and the thickness T1 of the layer 14 of silicon oxide is preferably 0.1 nm through 10 nm both inclusive. When it is smaller than 0.1 nm, the aluminum wire 20 and the silicon electrode 40 are separated from each other by a small force, such as a force caused by vibration, due to an insufficient mechanical bonding strength between the aluminum wire 20 and the silicon electrode 40. It is not preferable that the sum T1+T2 is larger than 10 nm, because in this case the electrical resistance is increased and thus electrical connection between the aluminum wire 20 and the silicon electrode 40 becomes difficult.

Next, a method for bonding the aluminum wire 20 to the silicon electrode 40 will be described.

Figure 2:
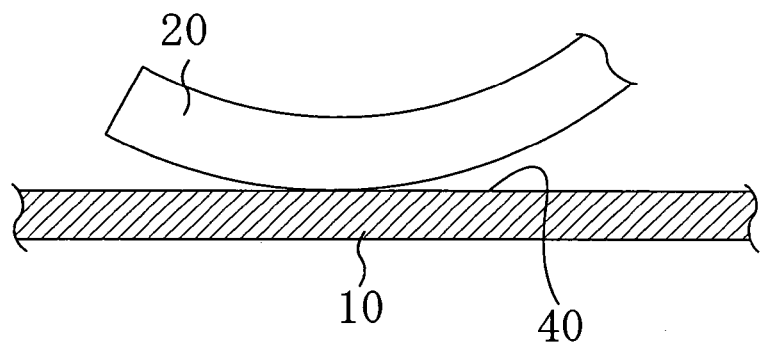
FIG. 2 is a cross-sectional view in which the aluminum wire is brought into contact with the silicon electrode.

First, as illustrated in FIG. 2, the aluminum wire 20 is brought into contact with the silicon electrode 40 in the air by bringing the aluminum wire 20 near the silicon electrode 40.

Figure 3:
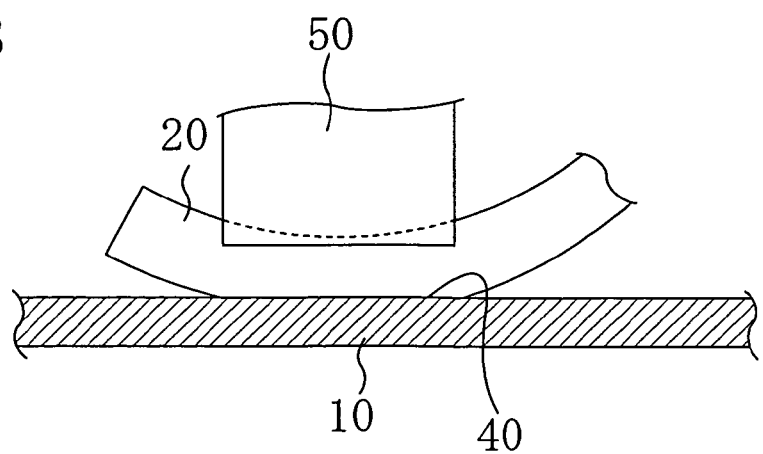
FIG. 3 is a cross-sectional view in which the aluminum wire is bonded to the silicon electrode by a wedge tool.

Next, as illustrated in FIG. 3, the aluminum wire 20 is pressed against the silicon electrode 40 by a wedge tool 50, and ultrasound is applied to the aluminum wire 20 by the wedge tool 50. In this way, an oxide formed at the interface at which the aluminum wire 20 is bonded to the silicon electrode 40 is removed by friction caused by ultrasonic vibration. Simultaneously, heat is generated at the interface by this friction. This sharply reduces the tensile strength of the aluminum wire 20, and therefore the aluminum wire 20 is plastically deformed. As a result, solid-phase bonding is obtained between the aluminum wire 20 and the silicon electrode 40. Since the aluminum wire 20 and the silicon electrode 40 are bonded to each other in the air containing oxygen, an oxide is formed at the interface. The top surface of the aluminum wire 20 before the plastic deformation thereof is illustrated by the broken line in FIG. 3.

In the above-mentioned case, the bonding between the aluminum wire 20 and the silicon electrode 40 is preferably carried out under the conditions that the wedge tool 50 is pressed against the aluminum wire 20 at a force of 0.14 N through 0.4 N both inclusive and ultrasound is applied to the aluminum wire 20 at an ultrasonic frequency of 60 kHz through 140 kHz both inclusive for 30 ms through 50 ms both inclusive. When the load at which the wedge tool 50 is pressed against the aluminum wire 20 is smaller than 0.14 N, the aluminum wire 20 is insufficiently bonded to the silicon electrode 40. On the other hand, it is not preferable that the load is larger than 0.4 N, because the silicon electrode 40 is cratered (the silicon electrode 40 is separated from a layer located below the silicon electrode 40). When the ultrasonic frequency is less than 60 kHz, bonding failures occur. On the other hand, it is not preferable that the ultrasonic frequency is more than 140 kHz, because the silicon electrode 40 is cratered. When the time during which the ultrasound is applied to the aluminum wire 20 is less than 30 ms, bonding failures occur. On the other hand, it is not preferable that the time during which the ultrasound is applied to the aluminum wire 20 is more than 50 ms, because the shape of the bonded part 30 becomes deformed.

Figure 4:
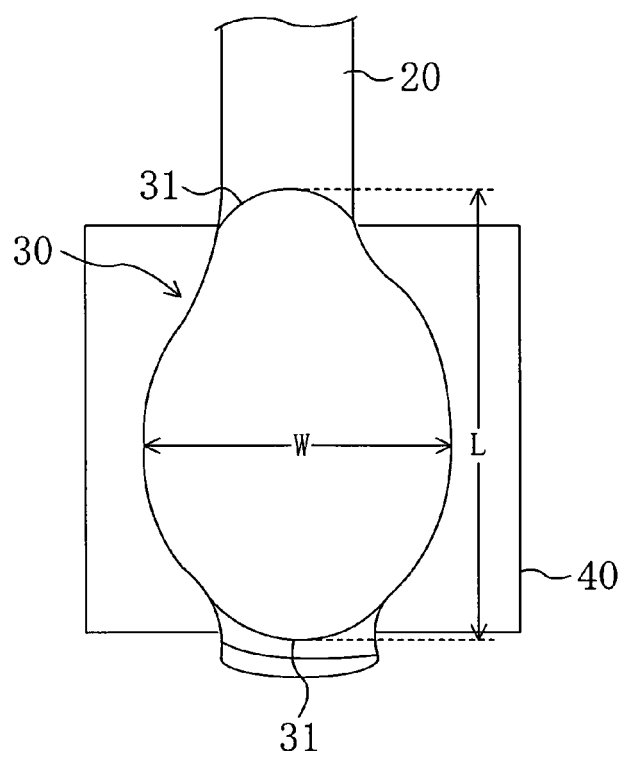
FIG. 4 is a top view of FIG. 1.

FIG. 4 is a top view of FIG. 1. The width W of the crushed and thus deformed bonded part 30 of the aluminum wire 20 becomes approximately 2.4 times that of each of parts of the aluminum wire 20 that are not deformed. The length L of the crushed and thus deformed part of the aluminum wire 20 (the distance between two boundaries 31 and 31 of the deformed part of the aluminum wire 20 and parts thereof that are not deformed) is larger than that of the silicon electrode 40. The deformed part of the aluminum wire 20 partly exists also outside the silicon electrode 40. Since the crushed and thus deformed part of the aluminum wire 20 extends as described above, this allows the bonded part 30 of the aluminum wire 20 and the silicon electrode 40 to be securely and firmly bonded to each other. When the width of the deformed part of the aluminum wire 20 becomes smaller than 1.5 times that of each part thereof that is not deformed, this provides an insufficient bonding strength. Therefore, the width of the deformed part of the aluminum wire 20 is preferably 1.5 times or more as large as that of the part thereof that is not deformed.

When the aluminum wire 20 is bonded to the silicon electrode 40 in the above-mentioned manner, the crushed bonded part 30 of the aluminum wire 20 has a larger silicon content than the other parts thereof. The reason for this is that the above-mentioned bonding permits diffusion of silicon from the silicon electrode 40 into the aluminum wire 20. Part of the bonded part 30 of the aluminum wire 20 located near the silicon electrode 40 has a larger silicon content than part thereof located distant from the silicon electrode 40.

Furthermore, the bonding allows part of the silicon electrode 40 located below a layer 14 of silicon oxide to contain aluminum.

As described above, the aluminum wire 20 is bonded to the silicon electrode 40 such that aluminum, aluminum oxide, silicon oxide, and silicon are sequentially stacked. This allows aluminum and silicon to be firmly bonded to each other and electrically connected to each other. Furthermore, the bonding between the aluminum wire 20 and the silicon electrode 40 is carried out in the manner in which the aluminum wire 20 is pressed against the silicon electrode 40 by the wedge tool 50 and ultrasound is applied to the aluminum wire 20 by the wedge tool 50. This permits simple short-time bonding at low cost.

Embodiment 2

In a second embodiment, a chip size package (CSP) is fabricated by bonding aluminum bumps to silicon electrodes formed in the top surface of a silicon substrate (semiconductor chip) at which semiconductor circuits are formed and mounting the semiconductor chip on a package substrate with the aluminum bumps interposed therebetween.

FIGS. 6A through 6D illustrates process steps for fabricating a CSP according to this embodiment.

Figure 6A:
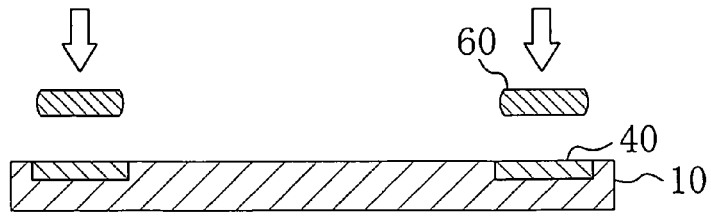
FIGS. 6A through 6D are cross-sectional views illustrating process steps for fabricating a CSP according to a second embodiment.

First, as illustrated in FIG. 6A, aluminum bumps 60 are formed on a plurality of silicon electrodes 40 formed in the top surface of a silicon substrate (semiconductor chip) 10 at which semiconductor circuits are formed. Each aluminum bump 60 is large enough to cover substantially the entire surface of the associated silicon electrode 40. The plurality of silicon electrodes 40 exists in the top surface of the silicon substrate 10, and the aluminum bumps 60 are placed on all of the silicon electrodes 40, respectively.

Figure 6B:

Next, as illustrated in FIG. 6B, the aluminum bumps 60 are bonded to the silicon electrodes 40 by an unshown wedge tool pressing the aluminum bumps 60 against the silicon electrodes 40 and applying ultrasound and a load to the silicon electrodes 40. In this case, the conditions under which they are bonded to the silicon electrodes 40 are the same as in the first embodiment. In this embodiment, all of the aluminum bumps 60 formed on the single silicon substrate 10 are bonded to the silicon electrodes 40, respectively. The bonding as mentioned above allows a layer of aluminum oxide and a layer of silicon oxide to extend between the aluminum bumps 60 and the silicon electrodes 40 as in the first embodiment. Therefore, the aluminum bumps 60 and the silicon electrodes 40 are securely and firmly connected to each other from both electrical and mechanical aspects at low cost. The layer of aluminum oxide and the layer of silicon oxide have the same thicknesses as in the first embodiment.

Figure 6C:
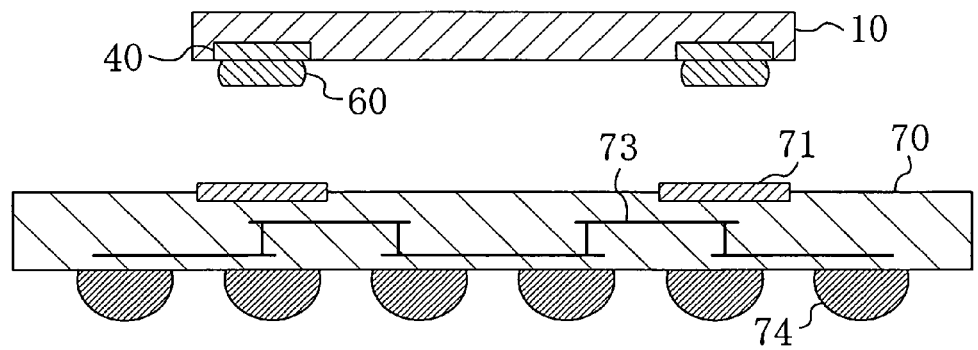

Subsequently, as illustrated in FIG. 6C, the silicon substrate 10 is disposed so as to be opposed to a package substrate 70. In this case, the aluminum bumps 60 formed on the silicon substrate 10 and electrodes 71 formed at the top surface of the package substrate 70 (hereinafter, referred to as "package-substrate-side electrodes 71") are aligned so as to be opposed to each other. Solder balls 74 are formed on the opposite surface of the package substrate 70 to the surface thereof at which the package-substrate-side electrodes 71 are formed. The package-substrate-side electrodes 71 and the solder balls 74 are wired inside the package substrate 70 so as to be electrically connected to each other.

Figure 6D:
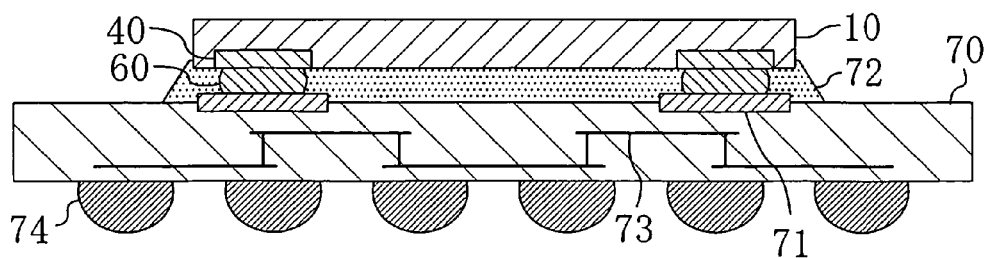

Next, as illustrated in FIG. 6D, the aluminum bumps 60 formed on the silicon substrate 10 and the package-substrate-side electrodes 71 formed at the top surface of the package substrate 70 are electrically connected to each other by bringing them into contact with each other. An underfill material 72 is allowed to flow between the silicon substrate 10 and the package substrate 70 and cured, thereby protecting respective parts of the silicon electrodes 40 and the package-substrate-side electrodes 71 connected to each other. In the above-mentioned way, a CSP is completed. A larger area of the silicon substrate 10 may be encapsulated in resin. In this embodiment, a so-called "capillary flow" process is used for the resin encapsulation. However, instead of the "capillary flow" process, a "compression flow" process may be used in which resin encapsulant is applied to the silicon substrate 10 and the package substrate 70 in advance and the aluminum bumps 60 formed on the silicon substrate 10 and the package-substrate-side electrodes 71 formed at the top surface of the package substrate 70 are electrically connected to each other by bringing them into contact with each other.

In this embodiment, the aluminum bumps 60 can be bonded to the silicon electrodes 40 formed in the top surface of the silicon substrate 10 by simple short-time process steps. This bonding allows the aluminum bumps 60 and the silicon electrodes 40 to be securely and firmly connected to each other from both electrical and mechanical aspects at low cost.

Other Embodiments

The above-described embodiments exemplify the present invention, and the present invention is not limited to these embodiments. As long as aluminum and silicon are bonded to each other, objects to be bonded to each other are not limited to aluminum wires, aluminum bumps, or silicon electrodes. Furthermore, aluminum wires may contain silicon but does not have to contain silicon. Aluminum bumps on a silicon substrate may be bonded to silicon electrodes one after another like single-point bonding or may be bonded thereto at the same time. The present invention may be applied to not only semiconductor integrated circuits and MEMS devices but also optical devices, such as image sensors and laser devices. The present invention may be used to bond electrodes formed at not only a silicon substrate but also a silicon germanium (SiGe) substrate, a silicon germanium carbon (SiGeC) substrate, a gallium arsenic (GaAs) substrate, and any other substrate.

As described above, in the present invention, an aluminum oxide layer and a silicon oxide layer are formed between aluminum and silicon. More particularly, aluminum, aluminum oxide, silicon oxide, and silicon are sequentially stacked. This allows aluminum and silicon to be firmly bonded to each other. This bonding method can be simply carried out at low cost.

What is claimed is:

1. A bonded structure between an aluminum bonding member and a silicon electrode, wherein
    at an interface at which the aluminum bonding member and the silicon electrode are bonded to each other, a layer of aluminum oxide and a layer of silicon oxide exist between the aluminum bonding member and the silicon electrode, and the aluminum bonding member, the layer of aluminum oxide, the layer of silicon oxide, and the silicon electrode are sequentially stacked,
    the aluminum bonding member comes into direct contact with the layer of aluminum oxide, while the silicon electrode comes into direct contact with the layer of silicon oxide,
    the layer of aluminum oxide comes into direct contact with the layer of silicon oxide, and
    the aluminum bonding member and the silicon electrode are electrically connected to each other at the interface.

2. The bonded structure of claim 1, wherein the layer of aluminum oxide and the layer of silicon oxide each have a substantially uniform thickness.

3. The bonded structure of claim 1, wherein the sum of the thicknesses of the respective layers of aluminum oxide and silicon oxide is 0.1 nm through 10 nm both inclusive.

4. The bonded structure of claim 1, wherein a natural oxide film existing on the top surface of part of the silicon electrode in a portion in which the aluminum bonding member and the silicon electrode are not in contact with each other has a larger thickness than the layer of silicon oxide.

5. The bonded structure of claim 1, wherein at least part of the aluminum bonding member coming into contact with the layer of aluminum oxide contains silicon.

6. The bonded structure of claim 1, wherein part of the silicon electrode coming into contact with the layer of silicon oxide contains aluminum.

7. A bonded structure between an aluminum bonding member containing silicon and a silicon electrode, wherein
    a part of the aluminum bonding member bonded to the silicon electrode is crushed and deformed,
    the crushed part of the aluminum bonding member has a larger silicon content than a part thereof that is not deformed,
    a layer of aluminum oxide and a layer of silicon oxide exist at the interface at which the aluminum bonding member and the silicon electrode are bonded to each other, while coming into contact with each other,
    the aluminum bonding member comes into contact with the layer of aluminum oxide, and the silicon electrode comes into contact with the layer of silicon oxide, and the aluminum bonding member and the silicon electrode are electrically connected to each other at the interface.

8. The bonded structure of claim 7, wherein the sum of the thicknesses of the respective layers of aluminum oxide and silicon oxide is 0.1 nm through 10 nm both inclusive.

9. The bonded structure of claim 7, wherein the crushed and deformed part of the aluminum wire partly exists outside the silicon electrode.

10. The bonded structure of claim 1, wherein the layer of aluminum oxide has a smaller thickness than the layer of silicon oxide.

11. The bonded structure of claim 7, wherein the layer of aluminum oxide has a smaller thickness than the layer of silicon oxide.

12. A bonded structure between an aluminum wire containing silicon and a silicon electrode, wherein
    a wire thickness of a part of the aluminum wire bonded to the silicon electrode is smaller than a wire diameter of a part of the aluminum wire that is not in contact with the silicon electrode,
    a layer of aluminum oxide and a layer of silicon oxide exist at the interface at which the aluminum wire and the silicon electrode are bonded to each other, while coming into contact with each other,
    the aluminum wire comes into contact with the layer of aluminum oxide, and the silicon electrode comes into contact with the layer of silicon oxide, and
    the aluminum wire and the silicon electrode are electrically connected to each other at the interface.

13. The bonded structure of claim 12, wherein a width of a part of the aluminum wire at the interface is 1.5 times or more as large as a diameter of the part thereof that is not bonded.

14. The bonded structure of claim 1, wherein the aluminum bonding member is formed as an aluminum bonding wire.

15. The bonded structure of claim 1, wherein the aluminum bonding member is formed as an aluminum bump.

16. The bonded structure of claim 7, wherein the aluminum bonding member is formed as an aluminum bonding wire.

17. The bonded structure of claim 7, wherein the aluminum bonding member is formed as an aluminum bump.

18. The bonded structure of claim 7, wherein the aluminum bonding member is formed so as to receive or deliver an electric signal between the silicon electrode and an external circuit.

19. A semiconductor device, comprising:
    a semiconductor chip; and
    a substrate on which the semiconductor chip is mounted,
    wherein an aluminum bonding member and a silicon electrode are bonded to each other,
    the interface at which the aluminum wire and the silicon electrode are bonded to each other has the bonded structure as recited in claim 1, and
    the semiconductor chip and the substrate are connected to each other by the aluminum bonding member.

* * * * *

UNITED STATES PATENT AND TRADEMARK OFFICE
CERTIFICATE OF CORRECTION

PATENT NO.       : 7,629,688 B2                                        Page 1 of 1
APPLICATION NO.  : 11/491029
DATED            : December 8, 2009
INVENTOR(S)      : Minamio et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 304 days.

Signed and Sealed this

Second Day of November, 2010

David J. Kappos
*Director of the United States Patent and Trademark Office*